US012607574B2

(12) United States Patent
Kohira

(10) Patent No.: US 12,607,574 B2
(45) Date of Patent: Apr. 21, 2026

(54) SEMICONDUCTOR DEVICE AND PHYSICAL QUANTITY MEASURING DEVICE

(71) Applicant: Renesas Electronics Corporation, Tokyo (JP)

(72) Inventor: Kaoru Kohira, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 213 days.

(21) Appl. No.: 18/598,075

(22) Filed: Mar. 7, 2024

(65) Prior Publication Data

US 2024/0302294 A1 Sep. 12, 2024

(30) Foreign Application Priority Data

Mar. 9, 2023 (JP) ................................. 2023-037001

(51) Int. Cl.
  *G01N 22/04* (2006.01)
  *H01L 23/66* (2006.01)
(52) U.S. Cl.
  CPC .............. *G01N 22/04* (2013.01); *H01L 23/66* (2013.01); *H01L 2223/6677* (2013.01)
(58) Field of Classification Search
  CPC ........ G01B 15/04; G01N 22/00; G01N 22/04; G01S 13/0209; G01S 13/08; G01S 13/58; G01S 7/02; H01L 2223/6677; H01L 23/66
  See application file for complete search history.

(56) References Cited

U.S. PATENT DOCUMENTS

2006/0025897 A1* 2/2006 Shostak ............. G06K 19/0717
                                                701/1
2022/0140886 A1* 5/2022 Lau .................... H04B 7/06958
                                                375/267

FOREIGN PATENT DOCUMENTS

JP      2007200083 A * 8/2007 ............... G08G 1/09
JP      2016109657 A     6/2016

OTHER PUBLICATIONS

English translation JP 2007200083 A (Year: 2007).*

* cited by examiner

*Primary Examiner* — Eman A Alkafawi
*Assistant Examiner* — Courtney G Mcdonnough
(74) *Attorney, Agent, or Firm* — SCULLY, SCOTT, MURPHY & PRESSER, P.C.

(57) ABSTRACT

A semiconductor device includes a transmission device and a reception device generating a demodulating signal by receiving the transmission signal via the measuring object from the antenna, and performing a processing to the demodulating signal. The transmission device is configured to start modulation at a first phase. The reception device stores a first phase and a physical quantity corresponding to a phase change amount in advance, estimate modulating signal start timing at which the reception signal switches from a non-modulation period to a modulation period based on a waveform of the demodulating signal; calculate a second phase that is a phase at the modulation start timing, calculates a variation to the second phase based on the stored first phase; and determine a physical quantity corresponding to the variation based on the physical quantity corresponding to a stored phase change amount.

9 Claims, 10 Drawing Sheets

<u>40</u>

SEMICONDUCTOR DEVICE AND PHYSICAL QUANTITY MEASURING DEVICE

CROSS-REFERENCE TO RELATED APPLICATION

This application claims priority under 35 U.S.C. § 119 to Japanese Patent Application No. 2023-037001 filed on Mar. 9, 2023. The disclosure of Japanese Patent Application No. 2023-037001, including the specification, drawings and abstract, is incorporated herein by reference in its entirety.

BACKGROUND

The present disclosure relates to a semiconductor device, and is applicable to, for example, a semiconductor device and a physical quantity measuring device that detect a change in physical quantities such as moisture content.

There is a disclosed technique listed below.

[Patent Document 1] Japanese Unexamined Patent Application Publication No. 2016-109657

Patent Document 1 discloses a device that, by transmitting radio waves toward an object, receiving reflection waves from the object, and analyzing the reception signals, measures a state or physical characteristics of the object, that is, a distance to the object, a relative velocity to the object, a shape, an internal structure, and the like.

SUMMARY

Depending on configurations of a device that transmits the radio waves and a device that receives the reflection waves, accurate measurements may not be made if the distance to the measuring object fluctuates.

Other problems and novel features will be apparent from the description of the present specification and the accompanying drawing.

The following is a brief description of an outline of the typical invention disclosed in the present application. That is, a semiconductor device includes a transmission device radiating, from an antenna to a measuring object, a transmission signal generated by modulating a carrier wave with a modulating signal, and a reception device generating a demodulating signal by receiving the transmission signal via the measuring object from the antenna, and performing a processing to the demodulating signal. The transmission device is configured to start modulation at a first phase. The reception device stores a first phase and a physical quantity corresponding to a phase change amount in advance, estimates modulating signal start timing at which the reception signal switches from a non-modulation period to a modulation period based on a waveform of the demodulating signal, calculates a second phase that is a phase at the modulation start timing, calculates a variation to the second phase based on the stored first phase, and determine a physical quantity corresponding to the variation based on the physical quantity corresponding to a stored phase change amount.

According to the above-mentioned semiconductor device, measurement can be made without depending on a measurement distance.

DETAILED DESCRIPTION

Figures 1, 2:
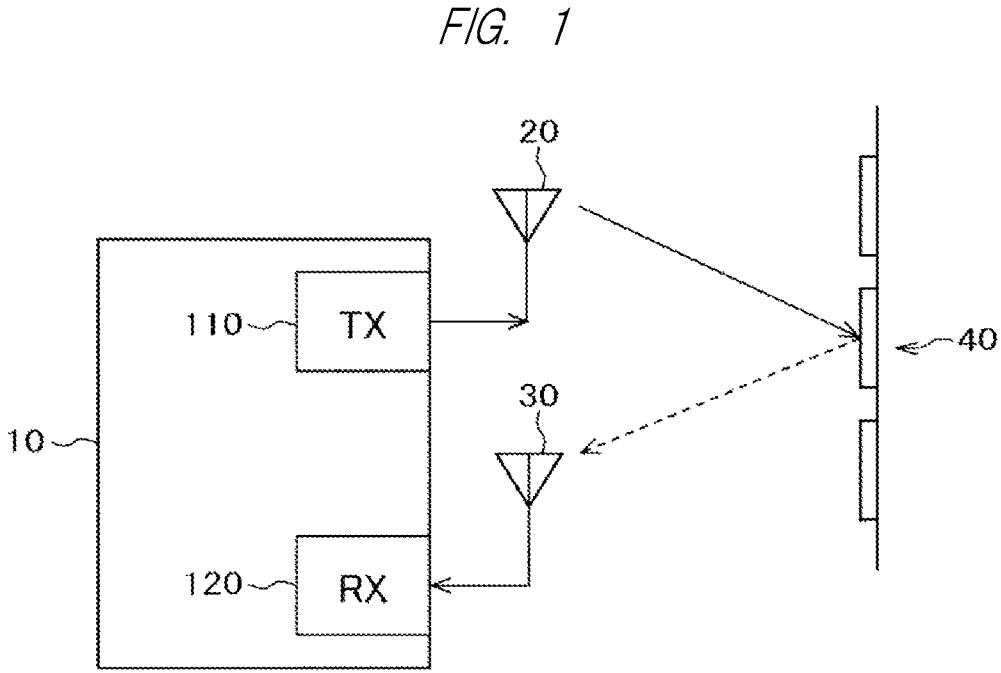
FIG. 1 is a diagram showing a configuration of a device for detecting a state of a measuring object in the present embodiment.
FIG. 2 is a front view showing a configuration of the measuring object.

Embodiments and comparative examples will be described below with reference to the drawings. However, for clarity of explanation, the following description and drawings are omitted and simplified appropriately. Further, the same components are given the same reference numerals and a repetitive explanation thereof may be omitted.

Figure 3:
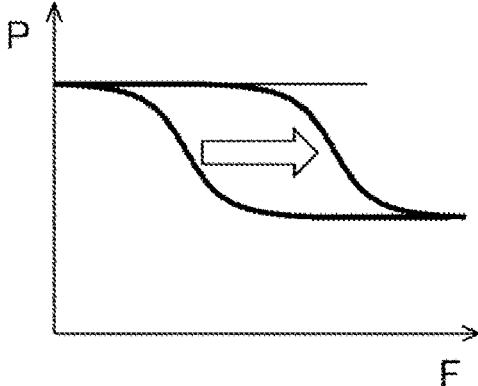
FIG. 3 is a diagram showing frequency phase characteristics.

An overview of the embodiment will be described by using FIGS. 1 to 3. FIG. 1 is a diagram showing a configuration of a device for detecting a state of a measuring object in the embodiment. FIG. 2 is a front view showing a configuration of the measuring object. FIG. 3 is a diagram showing frequency phase characteristics. A horizontal axis in FIG. 3 is frequency (F), and a vertical axis (P) is phase.

A semiconductor device 10 in the present embodiment irradiates a measuring object such as a battery-less (semiconductor chip-less) sensor with radio waves or sound waves to measure frequency phase characteristics of reflection characteristics or transmission characteristics of the measuring object, thereby measuring physical quantities such as moisture content. When irradiated with the radio waves, for example, moisture detection can be made. When irradiated with the sound waves, for example, acoustic characteristics can be measured.

The semiconductor device 10 includes a transmission device (TX) 110 connected to an antenna 20 and a reception device (RX) 120 connected to an antenna 30. The transmission device (TX) 110 and the reception device (RX) 120 perform, for example, ultrawide band (UWB) wireless communication. The UWB uses a very wide frequency band from several hundred MHz to several GHz. According to definition of the US Federal Communications Commission (FCC), the UWB is a wireless communication system that performs transmission and reception by using an extremely wide bandwidth whose 10 dB fractional bandwidth is 20% or more of a center frequency or 500 MHz or more. The semiconductor device 10 may be configured so as to include the transmission device 110 and the reception device 120 in one semiconductor chip, or may be configured so as to include them in separate semiconductor chips.

A measuring object 40 is made of a metamaterial(s). The metamaterial is a structure exhibiting an electromagnetic response(s) that does not exist in natural materials due to a periodic structure and the like on the order of wavelength or less. In a structure with a certain shape below a periodic wavelength, phases of reflected waves and transmitted waves change depending on the frequency (frequency phase characteristics change). The periodic structure is configured by, for example, periodically arranging conductive patterns 42 in an array on one surface of a printed board 41, which is provided with conductors (metal, for example, copper) on both surfaces of a substrate made of an insulating substance (dielectric substrate). The conductive pattern 42 is formed, for example, in a not-closed loop shape as shown in FIG. 2.

As shown in FIG. 3, the frequency phase characteristics of the measuring object 40 change depending on humidity (moisture content). As shown by an arrow, as moisture decreases, a frequency (F) at which a phase (P) changes becomes high. The moisture content can be measured by measuring a variation of the phase. The semiconductor device 10, the antennas 20 and 30, and the measuring object 40 configure a physical quantity measuring device.

Figure 4:
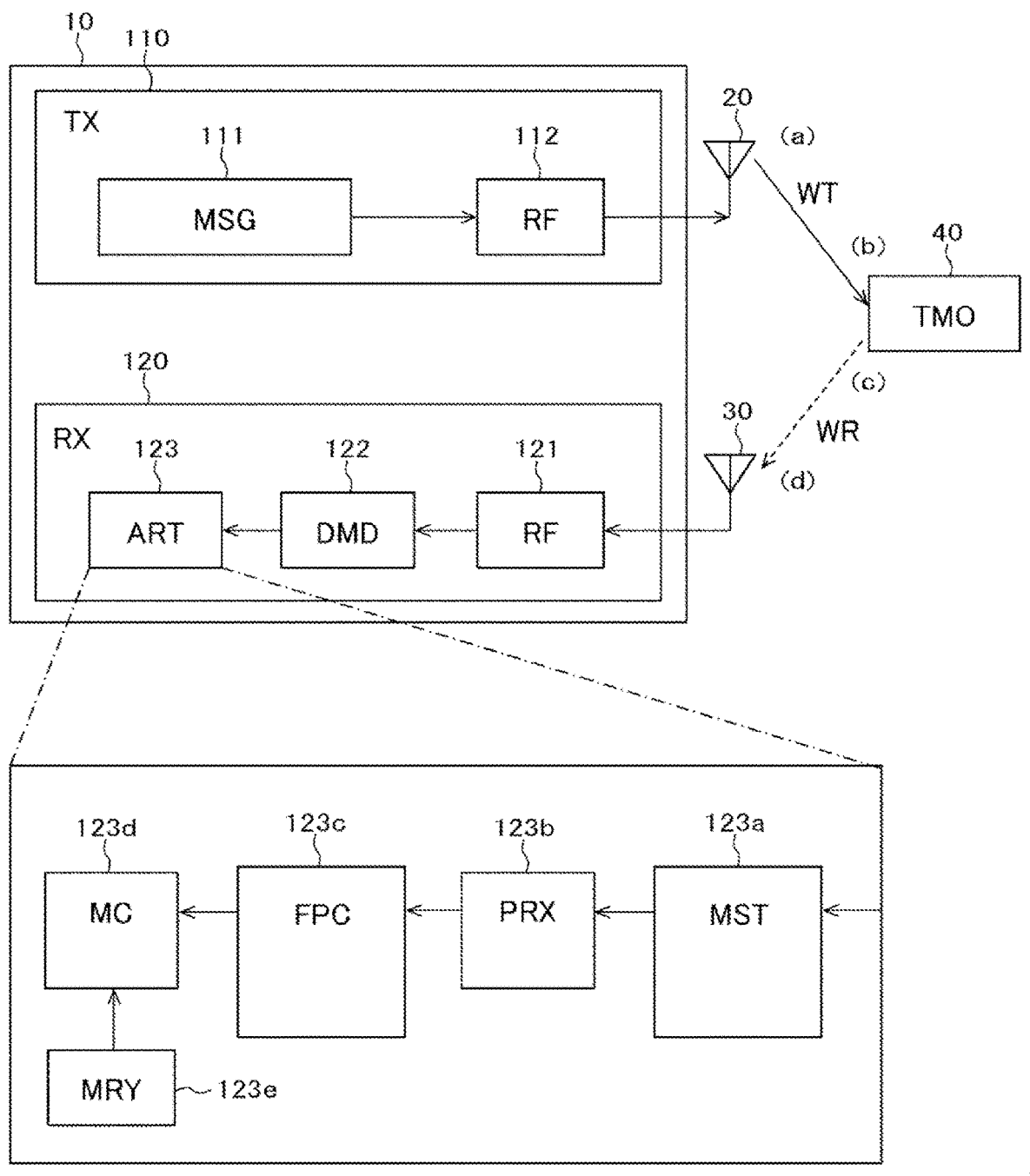
FIG. 4 is a block diagram showing a configuration of a semiconductor device shown in FIG. 1.

Details of a configuration of the semiconductor device 10 in the present embodiment will be explained by using FIG. 4. FIG. 4 is a block diagram showing a configuration of the semiconductor device shown in FIG. 1.

The transmission device 110 includes a modulation signal generation unit (MSG) 111 that outputs a modulating frequency signal, and an RF unit 112 that supplies an RF signal to the antenna 20. The antenna 20 radiates the measuring object (TMO) 40 with the RF signal as the transmission signal (WT).

The reception device 120 includes an RF unit 121 that amplifies the reception signal (WR) received by the antenna 30, a demodulation unit (DMD) 122 that demodulates and digitizes it, and an arithmetic unit (ART) 123. The antenna 30 receives the signal reflected by the measuring object 40 as the reception signal (WR).

The arithmetic unit 123 includes a modulation timing calculation unit (MST) 123a, a θRX calculation unit (PRX) 123b, a frequency phase characteristic calculation unit (FPC) 123c, and a physical quantity calculation unit (MC) 123d.

A storage unit 123e stores a relationship between the moisture content in the measuring object 40 and the frequency phase characteristics of the reflection characteristics or transmission characteristics of the radio waves in the measuring object. Note that the storage unit (MRY) 123e may be provided outside the arithmetic unit 123.

The frequency phase characteristics of the reflection characteristics or transmission characteristics of the radio wave in the measuring object 40 change depending on the moisture content possessed by it. The measuring object 40 is configured by a conductive pattern as shown in FIG. 2, for example.

Figure 5:
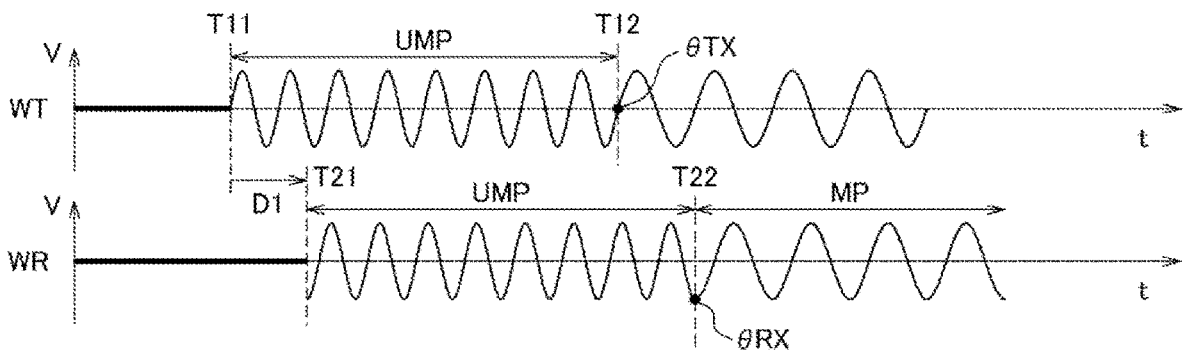
FIG. 5 is a waveform diagram showing an operation of the semiconductor device shown in FIG. 4.

An operation of the semiconductor device 10 in the present embodiment will be explained by using FIG. 5. FIG. 5 is a waveform diagram showing an operation of the semiconductor device shown in FIG. 4. A horizontal axis of FIG. 5 is time (t), and a vertical axis is voltage (V).

The modulation signal generation unit 111 starts outputting an unmodulated signal at timing (T11). The modulation signal generation unit 111 starts outputting a modulating signal at timing (T12). A phase at the timing (T12) is known θTX. In FIG. 5, θTX=0 degree.

The reception signal (WR) is a signal that arrives at the reception device 120 after the transmission signal (WT) is reflected or transmitted by the measuring object 40, and becomes a signal delayed by a time delay quantity (D1) from the transmission signal (WT).

The modulation timing calculation unit 123a estimates timing (T22) at which the modulation of the reception signal (WR) switching from a non-modulation period (UMP) to a modulation period (MP) is started.

The θRX calculation unit 123b calculates a phase (θRX) at the timing (T22) at which the estimated modulation is started. In FIG. 5, θRX=−90 degrees.

The frequency phase characteristic calculation unit 123c calculates a variation from θTX to θRX.

The physical quantity calculation unit 123d determines the moisture content by referring to a value obtained from the frequency phase characteristic calculation unit 123c (variation from θTX to θRX) and data stored in the storage unit 123e.

Each element described in the drawings as a functional block that performs various processings described above can be configured with a CPU (Central Processing Unit), a memory, or other circuits in terms of hardware. Furthermore, in terms of software, it is realized by a program and the like loaded into the memory. Therefore, these functional blocks may be configured in various forms using only hardware, only software, or a combination thereof, and are not limited to any one of them.

Comparative Example

Figure 6:
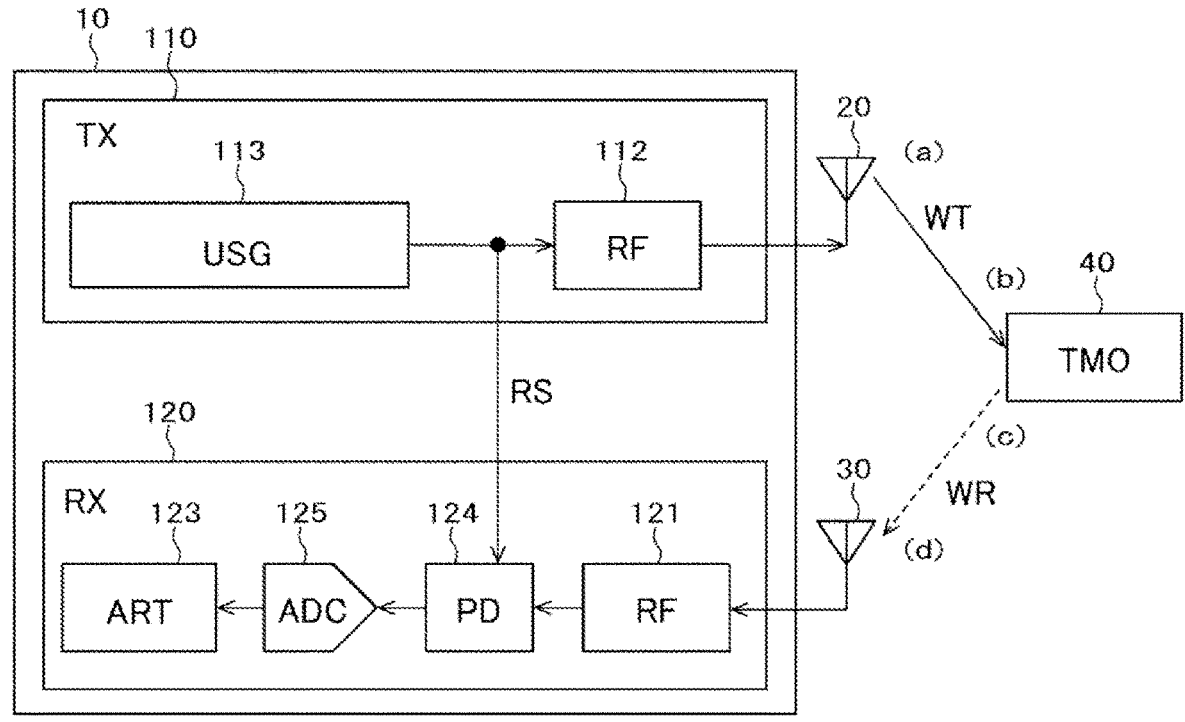
FIG. 6 is a block diagram showing a configuration of a device for detecting a state of a measuring object in a comparative example.

In order to clarify the present embodiment, a technique (comparative example) that the present discloser has considered prior to the present disclosure will be described with reference to FIGS. 6 and 7. FIG. 6 is a block diagram showing a configuration of a device for detecting a state of a measuring object in a comparative example. FIGS. 7A to 7D are waveform diagrams showing an operation of the device shown in FIG. 6. A horizontal axis in FIGS. 7A to 7D is time (t), and a vertical axis is electric field (E).

As shown in FIG. 6, the transmission device 110 in the comparative example includes a non-modulation signal generation unit (USG) 113 that outputs an unmodulated signal, and an RF unit 112 that supplies an RF signal to the antenna 20. The non-modulation signal generation unit 113 outputs a reference signal (RS) to the reception device 120.

As shown in FIG. 6, the reception device 120 in the comparative example includes the RF unit 121, the phase detector (PD) 124, the analog/digital converter (ADC) 125 for converting into a digital signal, and the arithmetic unit (ART) 123. The RF unit 121 amplifies the reception signal (WR) received by the antenna 30. The phase detector 124 outputs a phase difference between the reception signal (WR) and the reference signal (RS). The arithmetic unit 123 calculates the moisture content from the phase difference detected by the phase detector 124.

Figures 7A, 7B, 7C, 7D:
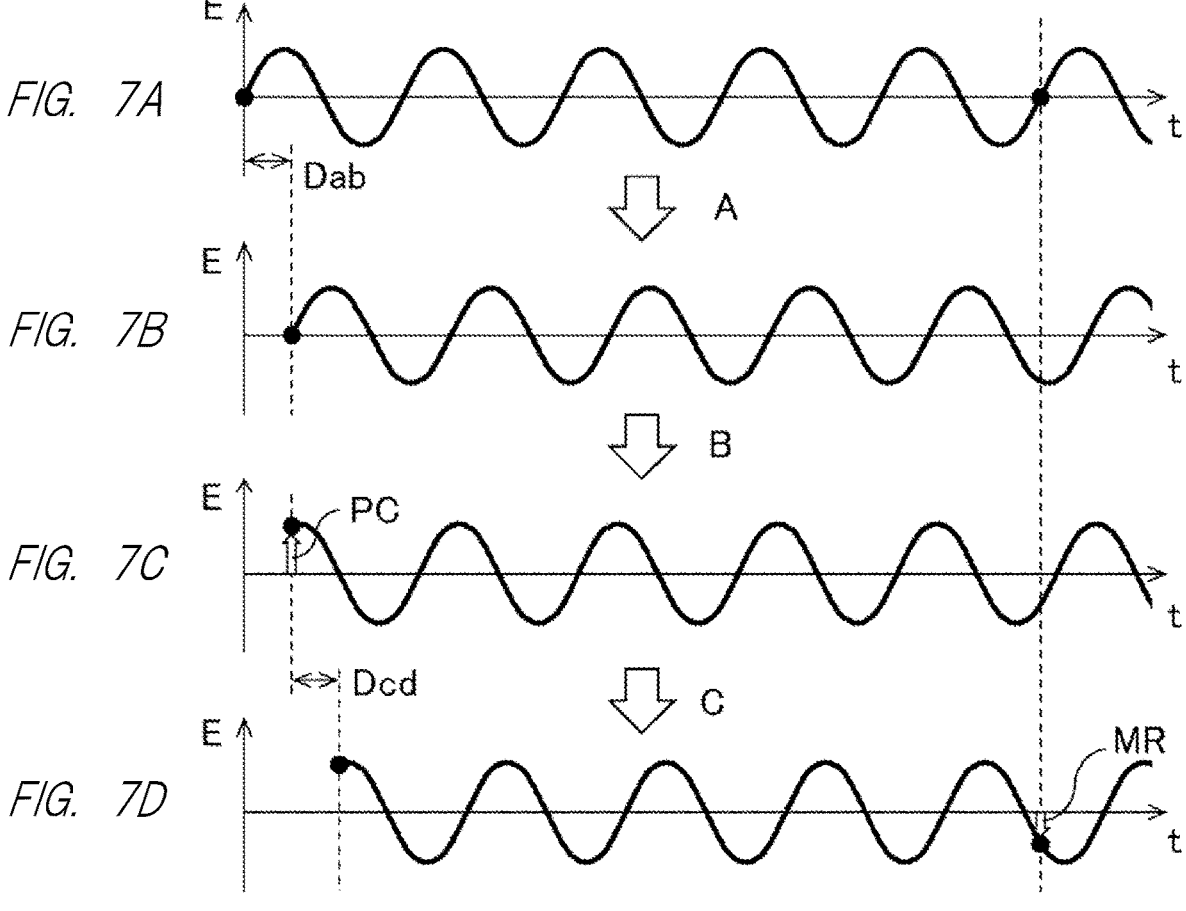
FIG. 7A, FIG. 7B, FIG. 7C and FIG. 7D are waveform diagrams showing an operation of the device shown in FIG. 6.

Here, in FIGS. 7A to 7D, FIG. 7A is an output waveform of the antenna 20 of the transmission device 110. FIG. 7B is an input waveform of the measuring object 40, and the phase has changed due to a delay (A) in the path with respect to FIG. 7A. That is, the phase is delayed due to the time delay (Dab) leading to the measuring object 40 from the transmission device 110. FIG. 7C is an output waveform of the measuring object 40, and the phase changes due to a phase change (B) in the measuring object 40 with respect to FIG. 7B. FIG. 7D is an input waveform of the antenna 20 of the reception device 120, and the phase changes due to a delay (C) in the path with respect to FIG. 7C. That is, the phase is delayed due to a time delay (Dcd) leading to the reception device 120 from the measuring object 40.

In the comparative example, the phase difference between the reference signal (RS) supplied from the transmission device 110 to the reception device 120 and the reception signal (WR) supplied from the antenna 30 of the reception device 120 is measured. As a result, as shown in FIGS. 7A-7D, a measurement result (MR) of the comparative example includes a phase change amount due to a time delay (Dab) and a phase change amount due to the time delay (Dcd) besides a phase change amount (PC) in the measuring object 40.

Therefore, in the comparative example, there is a problem in that accurate measurement cannot be performed if the distance from the semiconductor device 10 to the measuring object 40 changes.

Next, an operation of the physical quantity measuring device in the embodiment will be explained by using FIGS. 8A to 8D. FIGS. 8A to 8D are waveform diagrams showing an operation of the device shown in FIG. 4.

Figures 8A, 8B, 8C, 8D:
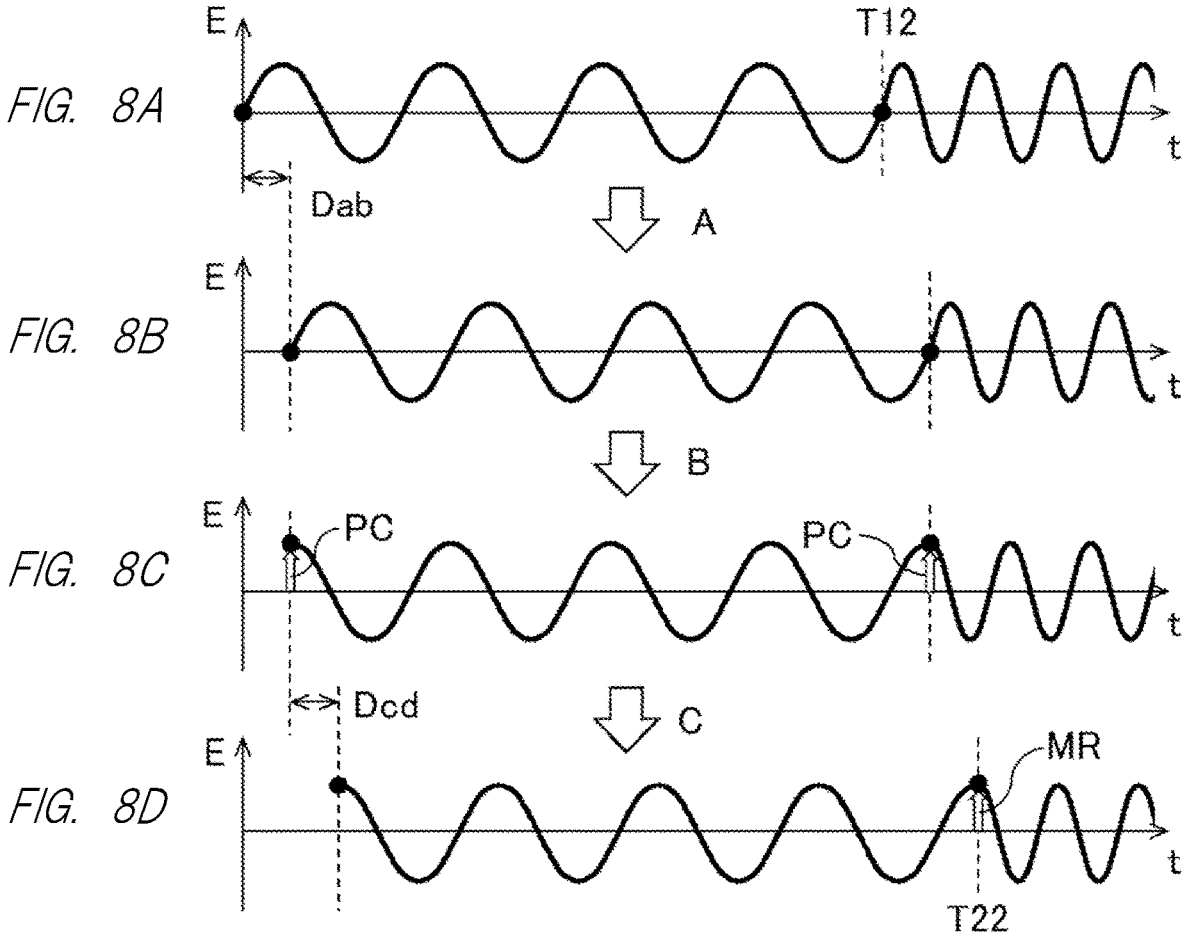
FIG. 8A, FIG. 8B, FIG. 8C and FIG. 8D are waveform diagrams showing an operation of the device shown in FIG. 4.

In FIGS. 8A to 8D, FIG. 8A is an output waveform of the antenna 20 of the transmission device 110. FIG. 8B is an input waveform of the measuring object 40, and the phase changes due to a delay (A) in the path with respect to FIG. 8A. That is, the phase is delayed due to a time delay (Dab) leading to the measuring object 40 from the transmission device 110. FIG. 8C is an output waveform of the measuring object 40, and the phase changes due to a phase change (B) in the measuring object 40 with respect to FIG. 8B. FIG. 8D is an input waveform of the antenna 20 of the reception device 120, and the phase changes due to a delay (C) in the path with respect to FIG. 8C. That is, the phase is delayed due to a time delay (Dcd) leading to the reception device 120 from the measuring object 4.

In the embodiment, the phase is measured at the timing (T22) at which the modulation of switching from the non-modulation period to the modulation period starts. Therefore, the measurement result (MR) includes only the phase change amount (PC) in the measuring object 40, and does not include the phase change amount due to the time delay (Dab) and the phase change amount due to the time delay (Dcd). Even if the distance from the semiconductor device 10 to the measuring object 40 changes, the phase change amount at the measuring object 40 can be measured with good accuracy.

In other words, since the reception device 120 does not make a comparison with the transmission signal but calculates the frequency phase characteristics from the reception signal, the frequency characteristics of the measuring object 40 can be accurately measured even if the distance from the transmission device 110 to the reception device 120 via the measuring object 40 change.

Note that since the reception device 120 does not use the transmission signal sent from the transmission device 110, a physical connection between the transmission device 110 and the reception device 120 becomes unnecessary.

Since the sensor, which is the measuring object in the present embodiment, is configured by the conductive pattern, a power source such as a battery is unnecessary. Further, the sensor in the present embodiment is inexpensive. Furthermore, the sensor in the present embodiment can easily ensure water resistance.

Modification Example

Hereinafter, some typical modification examples of the present embodiment will be illustrated. In the following descriptions of the modification examples, portions having the same configuration and function as those described in the above-described embodiment can use the same reference numerals as in the above-described embodiment. Then, as for explanation of such portions, the explanation in the above-mentioned embodiments can be used appropriately within a range that is not technically contradictory. Further, some of the above-described embodiments and all or part of the plurality of modification examples can appropriately be applied in combination within a range that is not technically contradictory.

First Modification Example

The semiconductor device 10 in the embodiment calculates the phase change amount by using a phase at modulation start timing of switching from the non-modulation period (UMP) to the modulation period (MP). On the other hand, the semiconductor device 10 in the first modification example calculates the phase change amount by using a phase at modulation end timing of switching from the modulation period (MP) to the non-modulation period (UMP).

The modulation signal generation unit 111 of the transmission device 110 ends the modulation at the first timing (first phase).

The storage unit 123e of the reception device 110 stores in advance the moisture content corresponding to the first phase and the phase change amount. The modulation timing calculation unit 123a estimates the modulation end timing, at which the reception signal (WR) switches from the modulation period (MP) to the non-modulation period (UMP), based on a waveform of a demodulating signal. The θRX calculation unit 123b calculates a second phase that is the phase at the modulation end timing (second timing). The frequency phase characteristic calculation unit 123c calculates the variation to the second phase based on the first phase stored in the storage unit 123e. The physical quantity calculation unit 123d determines the moisture content corresponding to the phase change amount based on the moisture content corresponding to the phase change amount stored in the storage unit 123e.

Second Modification Example

The semiconductor device 10 in the embodiment calculates the phase change amount by using the phase at the modulation start timing of switching from the non-modulation period (UMP) to the modulation period (MP). On the other hand, the semiconductor device 10 in the second modification example calculates the phase change mount by using a phase at timing, which is shifted by a predetermined time, from the modulation start timing of switching from the non-modulation period (UMP) to the modulation period (MP).

The modulation signal generation unit 111 of the transmission device 110 modulates it so as to have the first phase at timing shifted by a first time from the modulation start timing.

The storage unit 123e of the reception device 110 stores in advance the first time, the first phase, and the moisture content corresponding to the phase change amount. Based on the waveform of the demodulating signal, the modulation timing calculation unit 123a estimates timing shifted by the first time from the modulation start timing at which the reception signal (WR) switches from the non-modulation period (UMP) to the modulation period (MP). The θRX calculation unit 123b calculates a second phase that is a phase at the timing shifted by the first time from the modulation start timing. The frequency phase characteristic calculation unit 123c calculates a variation to the second phase based on the first phase stored in the storage unit 123e. The physical quantity calculation unit 123d determines the moisture content corresponding to the phase change amount based on the moisture content corresponding to the phase change amount stored in the storage unit 123e.

Third Modification Example

The semiconductor device 10 in the embodiment calculates the phase change amount by using the phase at the modulation start timing of switching from the non-modulation period (UMP) to the modulation period (MP). On the other hand, the semiconductor device 10 in a third modification example calculates a phase change amount by using a phase at timing that is shifted by a predetermined time from the modulation end timing of switching from the modulation period (MP) to the non-modulation period (UMP).

The modulation signal generation unit 111 of the transmission device 110 modulates the signal so as to have the first phase at the timing shifted by the first time from the modulation end timing.

The storage unit 123e of the reception device 110 stores in advance the first time, the first phase, and the moisture content corresponding to the phase change amount. Based on the waveform of the demodulating signal, the modulation timing calculation unit 123a estimates timing shifted by the first time from the modulation end timing at which the reception signal (WR) switches from the modulation period (MP) to the non-modulation period (UMP). The θRX calculation unit 123b calculates the second phase that is the phase at the timing shifted by the first time from the modulation end timing. The frequency phase characteristic calculation unit 123c calculates the variation to the second phase based on the first phase stored in the storage unit 123e. The physical quantity calculating unit 123d determines the moisture content corresponding to the variation based on the moisture content corresponding to the phase change amount stored in the storage unit 123e.

Fourth Modification Example

Figure 9:
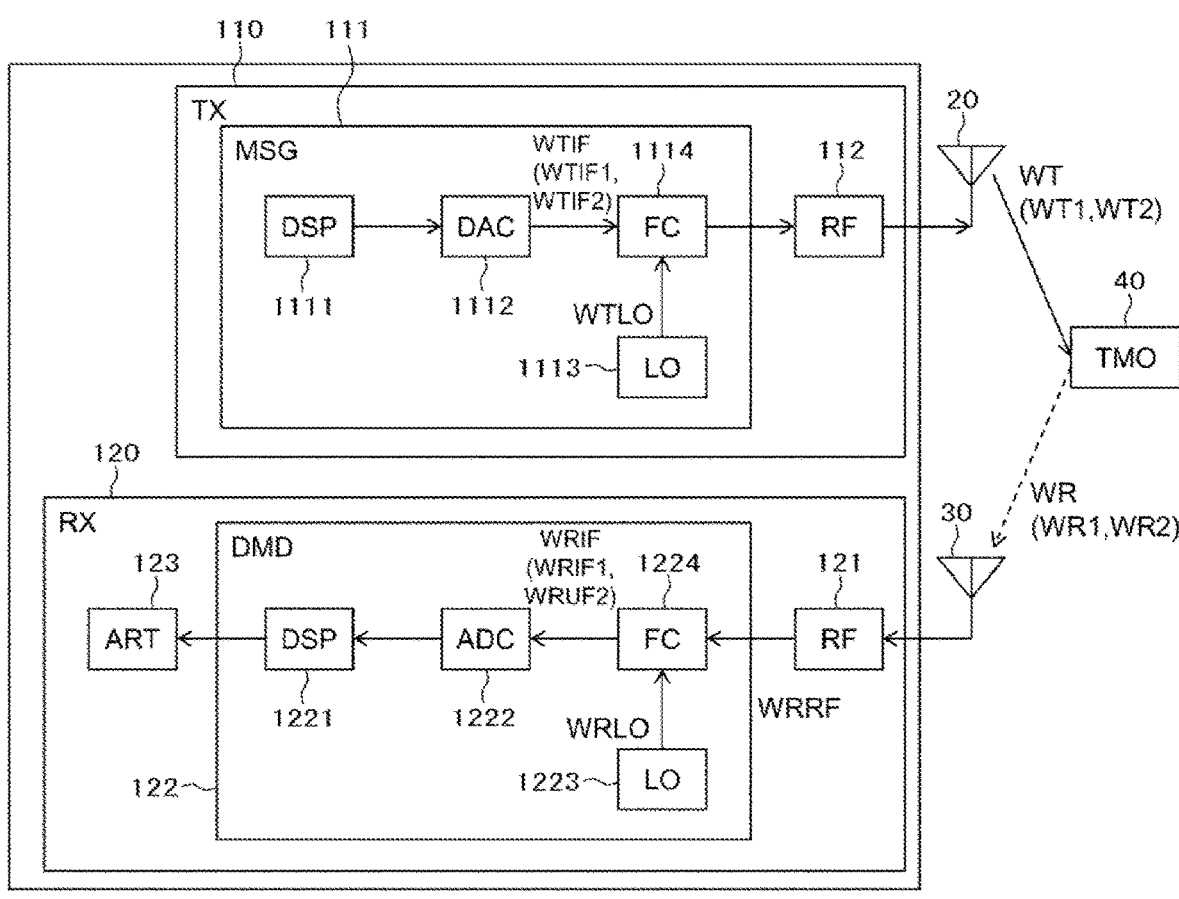
FIG. 9 is a block diagram showing a configuration of a semiconductor device in a fourth modification example.
Figures 10, 11:
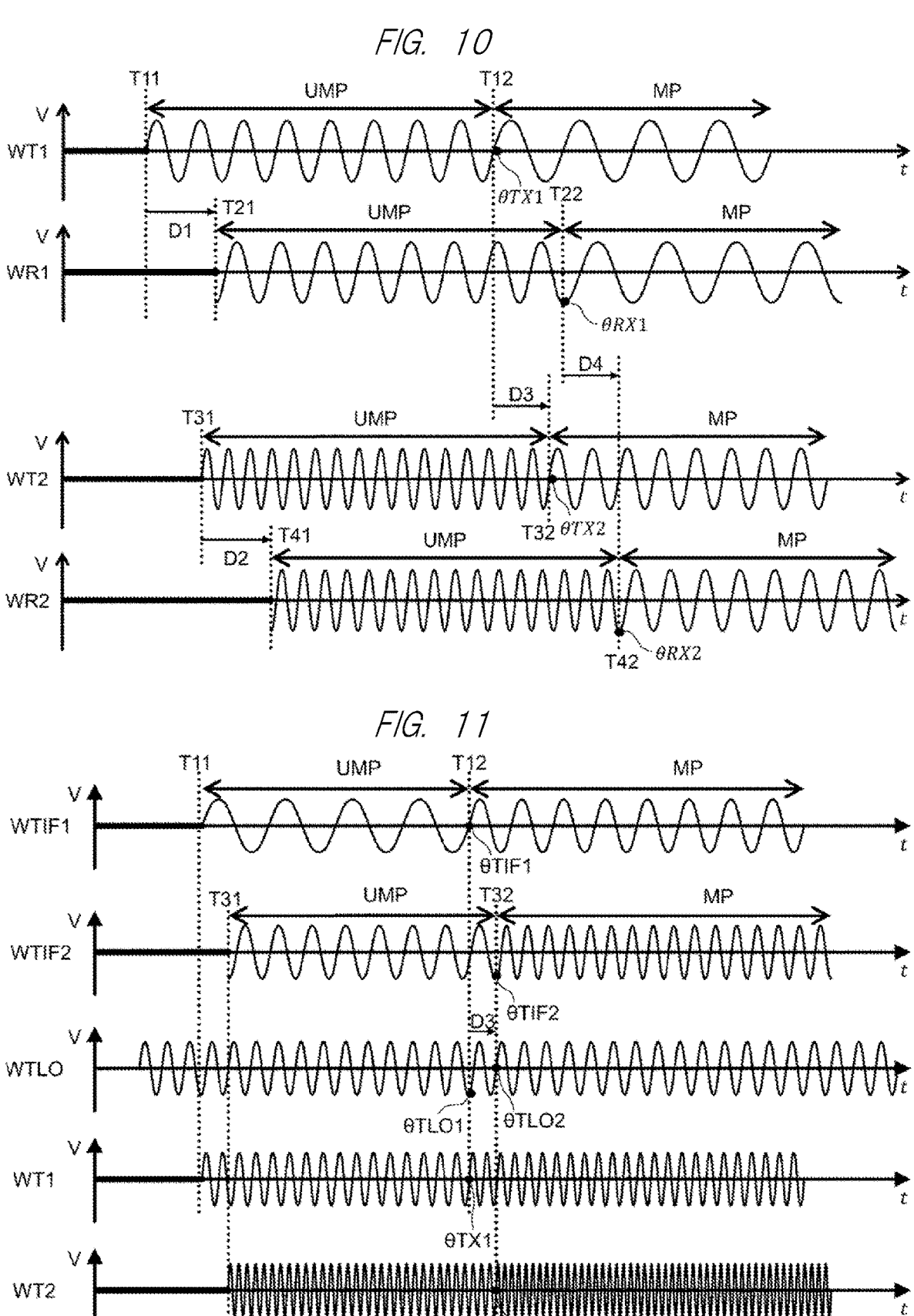
FIG. 10 is a waveform diagram showing an operation of the semiconductor device shown in FIG. 9.
FIG. 11 is a waveform diagram showing an operation of a modulating signal generation unit shown in FIG. 9.

A configuration and an operation of the semiconductor device 10 in a fourth modification example will be described by using FIGS. 9 and 10. FIG. 9 is a block diagram showing a configuration of a semiconductor device in a fourth modification. FIG. 10 is a waveform diagram showing an operation of the semiconductor device shown in FIG. 9. A horizontal axis in FIG. 10 is time (t), and a vertical axis is voltage (V).

The semiconductor device in the fourth modification example has the same configuration as the semiconductor device 10 shown in FIG. 4. However, the modulated signal generation unit 111 in the fourth modification example modulates and transmits a plurality of carrier waves. A modulation method and a modulation signal may be different for each carrier wave.

As shown in FIG. 9, the modulated signal generation unit (MSG) 111 includes an arithmetic unit (DSP) 1111 that generates a digital signal, a digital/analog converter (DAC) 1112, a local oscillator (LO) 1113 that generates a converting frequency signal, and a frequency converter (FC) 1114 that performs frequency conversion.

The modulation signal generation unit 111 includes a frequency converter 1114 for generating a high frequency signal. The frequency converter 1114 generates a transmission signal (WT) from an intermediate frequency signal (WTIF) outputted by the digital/analog converter (DAC) 1112 and a converting frequency signal (WTLO) outputted by the local oscillator (LO) 1113.

As shown in FIG. 9, the demodulation unit (DMD) 122 includes a local oscillator (LO) 1223 that generates a converting frequency signal, a frequency converter (FC) 1224 that performs frequency conversion, and an analog/digital converter (ADC) 1222, and an arithmetic unit (DSP) 1221 that demodulates an output signal of the ADC. The frequency converter (FC) 1224 generates the intermediate frequency signal (WRIF) from the reception signal (WR) and the converting frequency signal (WTLO) outputted from the local oscillator (LO) 1123.

As shown in FIG. 10, the modulation signal generation unit 111 starts outputting the unmodulated signal at the timing (T11), for example. The modulation signal generation unit 111 starts outputting the modulating signal at the timing (T12). The phase at the timing (T12) is known θTX1. In an example shown in FIG. 10, θTX1=0 degree. The transmission signal (WT1) uses f1 as the carrier frequency. Here, f1 is a frequency of one carrier wave among the plurality of carrier waves.

Further, the modulation signal generation unit 111 starts outputting the unmodulated signal at the timing (T31). The modulation signal generation unit 111 starts outputting the modulating signal at the timing (T32). The phase at the timing (T32) is known θTX2. In the example shown in FIG. 10, θTX2=0 degree. The transmission signal (WT2) uses f2 as the carrier frequency. Here, f2 is a frequency of another carrier wave among the plurality of carrier waves. A difference (D3) between the timing (T12) and the timing (T32) is a known value. A difference between θTX1 and θTX2 (θTX1−θTX2) is a known value.

The reception signal (WR1) is a signal that arrives at the reception device 120 after the transmission signal (WT1) is reflected or transmitted by the measuring object 40, and becomes a signal delayed by the time delay amount (D1) from the transmission signal (WT1). The reception signal (WR2) is a signal that arrives at the reception device 120 after the transmission signal (WT2) is reflected or transmitted by the measuring object 40, and becomes a signal delayed by the time delay amount (D2) from the transmission signal (WT2).

The modulation timing calculation unit 123a estimates the timing (T22) at which the modulation of the reception signal (WR1) switching from the non-modulation period (UMP) to the modulation period (MP) is started. The modulation timing calculation unit 123a estimates timing (T42) at which the modulation of the reception signal (WR2) switching from the non-modulation period (UMP) to the modulation period (MP) is started. A difference (D4) between the timing (T22) and the timing (T42) is estimated.

The θRX calculation unit 123b calculates the phase (θRX1) of the transmission signal (WT1) at the timing (T22)

at which the estimated modulation is started. In the example shown in FIG. 10, θRX1=−90 degrees. The θRX calculation unit 123*b* calculates the phase (θRX2) of the transmission signal (WT2) at the timing (T42) at which the estimated modulation is started. In the example shown in FIG. 10, θRX2=−90 degrees.

The frequency phase characteristic calculation unit 123*c* calculates the variation from D3, D4, and the difference between θTX1 and θTX2 (0 degree in the example shown in FIG. 10) to the difference between θRX1 and θRX2 (0 degree in the example shown in FIG. 10).

The physical quantity calculation unit 123*d* calculates the moisture content by referring to the value obtained from the frequency phase characteristic calculation unit 123*c* (the variation from the difference between θTX1 and θTX2 to the difference between θRX1 and θRX2) and the data stored in the storage unit 123*e*.

An operation of the modulated signal generation unit 111 will be explained by using FIG. 11. FIG. 11 is a waveform diagram showing an operation of the modulated signal generation unit shown in FIG. 9.

An intermediate frequency signal (WTIF1) is one unmodulated signal included in the intermediate frequency signal (WTIF), and is a signal obtained by modulating a sine wave signal whose frequency is an intermediate frequency (fIF1). An intermediate frequency signal (WTIF2) is one unmodulated signal included in the intermediate frequency signal (WTIF), and is a signal obtained by modulating a sine wave signal whose frequency is an intermediate frequency (fIF2). The converting frequency signal (WTLO) is a signal outputted by the local oscillator (LO) 1123.

A transmission signal (WT1) is one modulated signal included in the transmission signal (WT), and the intermediate frequency signal (WTIF1) is a converted frequency signal whose frequency is converted by the frequency converter (FC) 1114. A transmission signal (WT2) is one modulated signal included in the transmission signal (WT), and is a converted frequency signal obtained by frequency-converting the intermediate frequency signal (WTIF2) by the frequency converter (FC) 1114.

The modulating signal generation unit 111 starts outputting the unmodulated signal of the transmission signal (WT1) at the timing (T11). The modulating signal generation unit 111 starts outputting the modulating signal of the transmission signal (WT1) at the timing (T12). The phase of the intermediate frequency signal (WTIF1) at the timing (T12) is θTIF1.

The modulation signal generation unit 111 starts outputting the unmodulated signal of the transmission signal (WT2) at the timing (T31). The modulating signal generation unit 111 starts outputting the modulating signal of the transmission signal (WT2) at the timing (T32). The phase of the intermediate frequency signal (WTIF2) at the timing (T32) is θTIF2. Here, the time difference between the timing (T12) and the timing (T32) is D3.

The phase of the converting frequency signal (WTLO) at the timing (T12) is θTLO1. The phase of the converting frequency signal (WTLO) at the timing (T32) is θTLO2. The phase of the transmission signal (WT1) at the timing (T12) is θTX1. The phase of the transmission signal (WT2) at the timing (T32) is θTX2.

The transmission device 110 generates the transmission signal (WT1) and the transmission signal (WT2) so that the difference between θTX1 and θTX2 (θTX1−θTX2) becomes a predetermined value.

The phase (θTX1) of the transmission signal (WT1) at the timing (T12) is determined by the phase (θTIF1) of the intermediate frequency signal (WTIF1) and the phase (θTLO1) of the converting frequency signal (WTLO). Then, the phase (θTX2) of the transmission signal (WT2) at the timing (T32) is determined by the phase (θTIF2) of the intermediate frequency signal (WTIF2) and the phase (θTLO2) of the converting frequency signal (WTLO).

If the frequency conversion performed by the frequency conversion unit (FC) 1224 is, for example, frequency up-conversion, TX1 is determined by the sum of θTIF1 and θTLO1, and θTX2 is determined by the sum of θTIF2 and θTLO2.

The difference between θTLO1 and θTLO2 (θTLO1−θTLO2) can be estimated from the D3 and the frequency of the converting frequency signal (WTLO). The D3 can be adjusted in a process of generating a digital signal in the DSP 1111. From the above, adjustment of (θTX1−θTX2) can be realized.

According to the present modification example, the timing adjustment between the converting frequency signal (WTLO), which is a high-frequency analog signal, becomes unnecessary, and the transmission signal (WT), and a decrease in a degree of design difficulty and a reduction in costs are possible.

Figure 12:
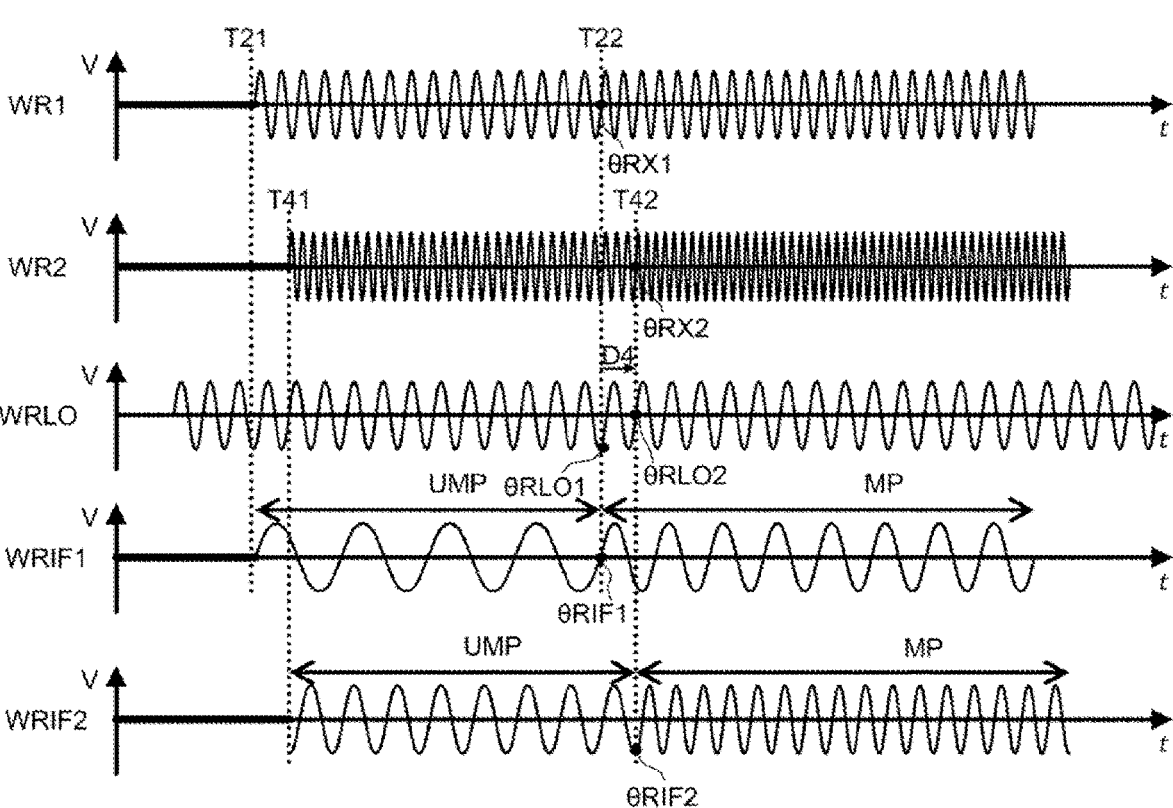
FIG. 12 is a waveform diagram showing an operation of a demodulation unit shown in FIG. 9.

An operation of the demodulation unit 122 will be explained by using FIG. 12. FIG. 12 is a waveform diagram showing an operation of the demodulation unit shown in FIG. 9.

The reception signal (WR1) is a signal in which one modulated signal included in the transmission signal (WT) reaches the reception device 120 via the measuring object 40. The reception signal (WR2) is a signal in which one modulated signal included in the transmission signal (WT) reaches the reception device 120 via the measuring object 40.

The timing (T21) is timing to start outputting the unmodulated signal of the reception signal (WR1). The timing (T22) is timing to start outputting the modulating signal of the reception signal (WR1). The phase of the reception signal (WR1) at the timing (T22) is θRX1.

The timing (T41) is timing to start outputting the unmodulated signal of the reception signal (WR2). The timing (T42) is timing to start outputting the modulating signal of the reception signal (WR2). The phase of the reception signal (WR2) at the timing (T42) is θRX2. Here, the time difference between the timing (T22) and the timing (T42) is D4.

The converting frequency signal (WRLO) is a signal outputted by the local oscillator (LO) 1223. The phase of the converting frequency signal (WRLO) at the timing (T22) is θRLO1. The phase of the converting frequency signal (WRLO) at the timing (T42) is θRLO2.

The intermediate frequency signal (WRIF1) is one modulated signal included in the intermediate frequency signal (WRIF), and is a converted frequency signal obtained by frequency-converting the reception signal (WR1) by the frequency converter (FC) 1224. The phase of the intermediate frequency signal (WRIF1) at the timing (T22) is θRIF1.

The intermediate frequency signal (WRIF2) is one modulated signal included in the intermediate frequency signal (WRIF), and is a converted frequency signal obtained by frequency-converting the reception signal (WR2) by the frequency converter (FC) 1224. The phase of the intermediate frequency signal (WRIF2) at the timing (T42) is θRIF2.

The reception device 120 estimates the frequency characteristics of the measuring object 40 from the difference between θRX1 and θRX2 (θRX1−θRX2).

The phase (θRIF1) of the intermediate frequency signal (WRIF1) at the timing (T22) is determined by the phase (θRX1) of the reception signal (WR1) and the phase (θRLO1) of the converting frequency signal (WRLO). Then, the phase (θRIF2) of the intermediate frequency signal (WRIF2) at the timing (T42) is determined by the phase (θRX2) of the reception signal (WR2) and the phase (θRLO2) of the converting frequency signal (WRLO).

If the frequency conversion performed by the frequency converter (FC) 1224 is, for example, frequency down-conversion, θRIF1 is determined by the difference between θRX1 and θRLO1, and θRIF2 is determined by the difference between θRX2 and θRLO2.

The difference between θRLO1 and θRLO (θRLO1−θRLO) can be estimated from the D4 and the frequency of the converting frequency signal (WRLO). The D4 can be estimated by the DSP 1221 based on the digital signal. By the above-mentioned procedure, (θRX1−θRX2) can be estimated without adjusting the timing of the high-frequency analog signal.

This makes it possible to measure the physical quantity by measuring the difference in frequency phase characteristics between the two different frequencies from (θTX1−θTX2) determined in advance and (θRX1−θRX2) estimated by the reception device 120.

Figure 13:
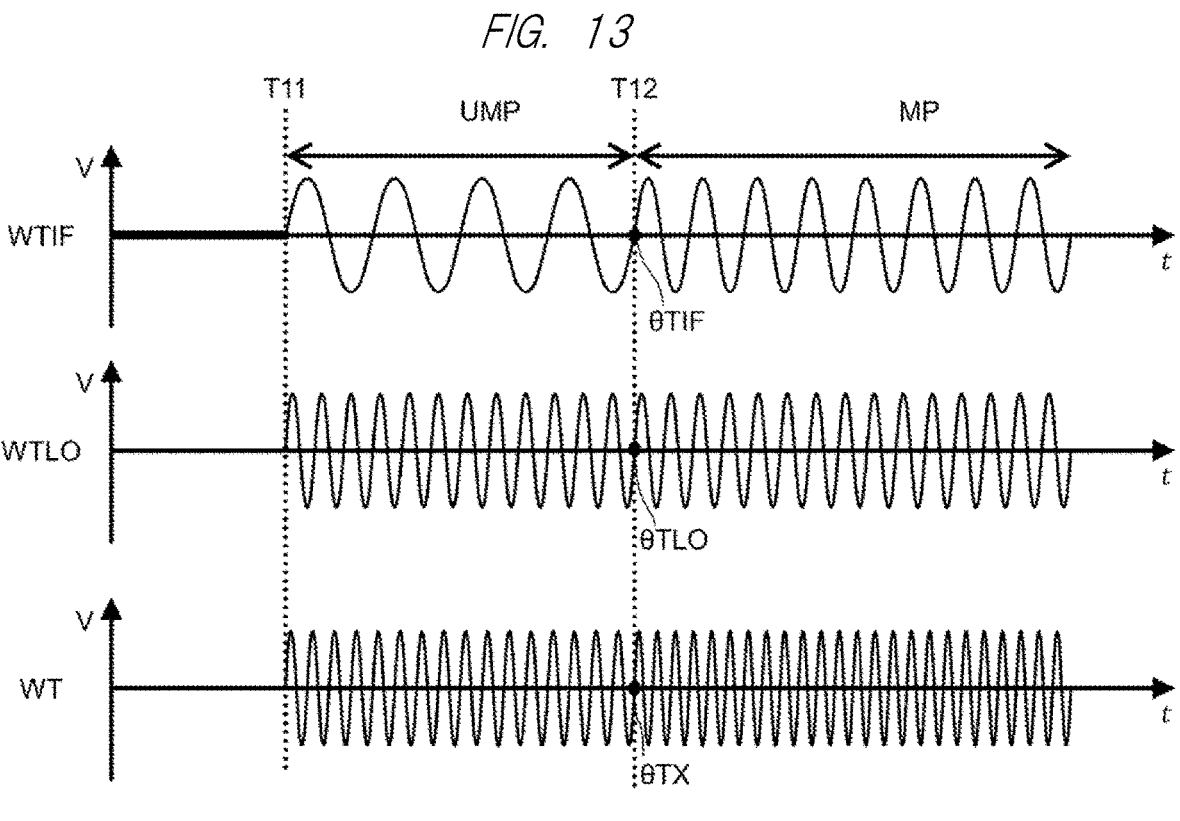
FIG. 13 is a waveform diagram showing an operation of a modulating signal generation unit in a comparative example of the fourth modification example.
Figure 14:
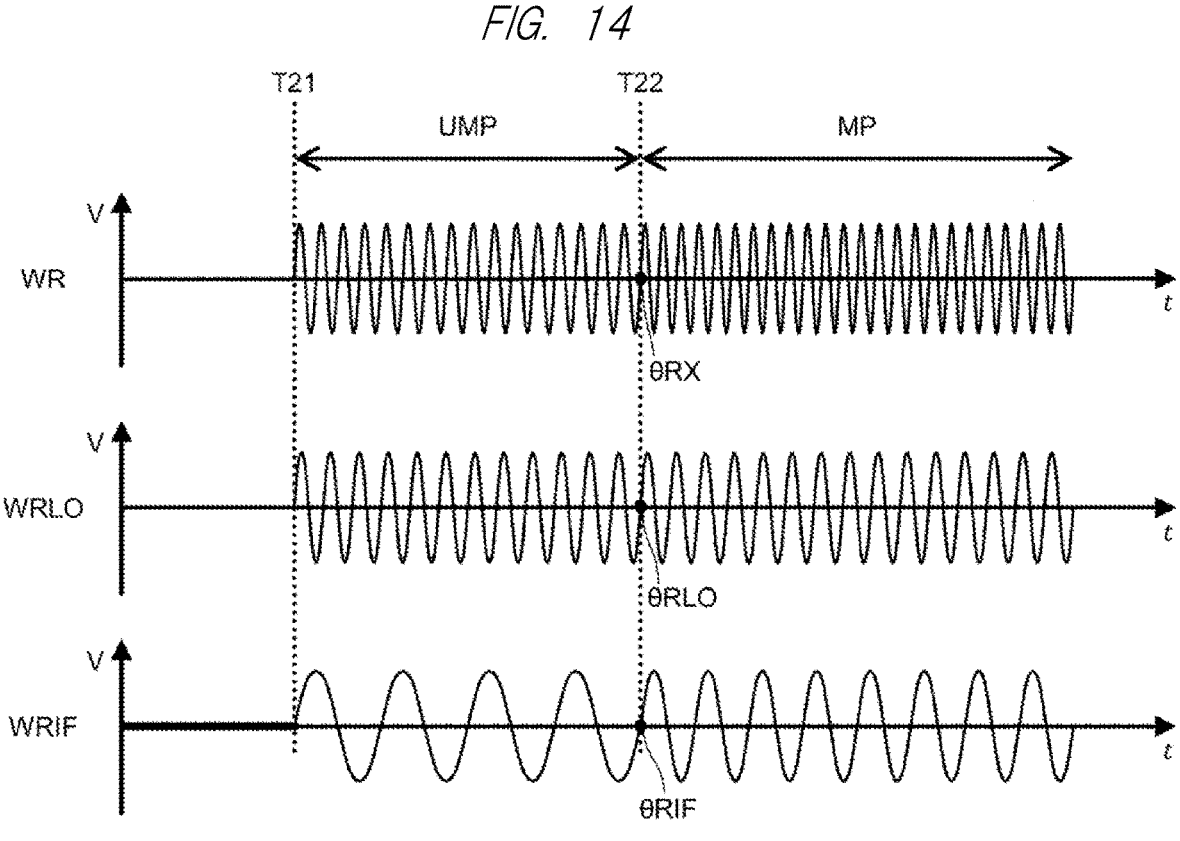
FIG. 14 is a waveform diagram showing an operation of a demodulation unit in the comparative example of the fourth modification example.

Effects of the fourth modification example will be explained. Since electrical or acoustic frequency characteristics change depending on the measuring object, such high frequencies as to be used in the UWB band may be suitable. A case (comparative example) in which the modulation signal generation unit 111 modulates and transmits one carrier wave will be described by using FIGS. 13 and 14. FIG. 13 is a waveform diagram showing an operation of the modulation signal generation unit in a comparative example of the fourth modification example. FIG. 14 is a waveform diagram showing an operation of the demodulation unit in a comparative example of the fourth modification example.

As shown in FIG. 13, a value of the phase (θTX) of the transmission signal (WT) at the timing (T12) at which the modulation is determined by the phase (θTX) of the intermediate frequency signal (WTIF) and the phase (θTLO) of the converting frequency signal (WTLO) at the timing (T12).

If the frequency conversion performed by the frequency converter (FC) 1114 is frequency up-conversion, it is determined by the sum of θTIF and θTLO. Therefore, in order to improve the accuracy of θTX, it is necessary to adjust the timing between the intermediate frequency signal (WTIF) and the converting frequency signal (WTLO).

For example, if the converting frequency signal (WTLO) is an 8 GHz sine wave used in the UWB band, the time accuracy of 0.347 ps (=1/(8 GHZ)/360) is required to align the phases with accuracy of 1 degree. Achieving this requires highly accurate design, which may increase costs.

As shown in FIG. 14, a value of the phase (θRIF) of the intermediate frequency signal (WRIF) at the timing (T22) at which the modulation is determine by the phase (θRX) of the transmission signal (WR) and the phase (θRLO) of the converting frequency at the timing (T22).

In order to accurately measure the difference between θRX and θRLO, the accuracy of θRLO is important. However, like the transmission device, the accurate phase adjustment requires highly time-accurate design, which may increase the costs.

As described above, the fourth modification example does not require the timing adjustment between the intermediate frequency signal (WTIF) and the converting frequency signal (WTLO).

The semiconductor device 10 in the fourth modification example calculates the phase change amount by using the phase of the modulation start timing of switching from the non-modulation period (UMP) to the modulation period (MP). Similarly to the first modification example, the phase change amount may be calculated by using the phase of the modulation end timing of switching from the modulation period (MP) to the non-modulation period (UMP). Also, as in the second modification example, the amount of phase change may be calculated by using the phase at the timing shifted by the predetermined time from the modulation start timing of switching from the non-modulation period (UMP) to the modulation period (MP). Further, as in the third modification example, the phase change amount may be calculated by using the phase at the timing shifted by the predetermined time from the modulation end timing of switching from the modulation period (MP) to the non-modulation period (UMP).

The disclosure made by the present inventor has been specifically explained based on the embodiments, but, needless to say, the present disclosure is not limited to the above-mentioned embodiments and can variously be modified.

For example, if the frequency phase characteristics of the reflection characteristics or transmission characteristics of sound waves change due to the change in the moisture content of the measuring object, the moisture content may be measured in a non-contact manner by using the sound waves. In this case, the transmission antenna in the embodiment is replaced with a speaker, and the reception antenna is replaced with a microphone.

In addition, if the frequency characteristics and the phase characteristics of reflection waves of radio waves change due to a change in physical quantities other than the moisture content of the measuring object, or the frequency phase characteristics of the reflection characteristics or the transmission characteristics of the sound waves change, the physical quantity may be measured.

What is claimed is:

1. A semiconductor device comprising:

a transmission device radiating a transmission signal from an antenna to a measuring object, the transmission signal being generated by modulating a carrier wave with a modulating signal; and a reception device generating a demodulating signal by the transmission signal receiving a reception signal via the measuring object with the antenna and being demodulated, the reception device performing a processing to the demodulating signal, wherein the transmission device is configured to switch starting and stopping modulation at a first phase, wherein the reception device is configured to:

store the first phase and a physical quantity corresponding to a phase change amount in advance;

estimate modulation switch timing, at which the reception signal switches between a non-modulation period and a modulation period, based on a waveform of the demodulating signal;

calculate a second phase that is a phase at the modulation switch timing;

calculate a variation to the second phase based on the stored first phase; and determine the physical quantity corresponding to the variation based on the physical quantity corresponding to the stored phase change amount.

2. The semiconductor device according to claim 1, wherein the measuring object is configured by metamaterial.

3. The semiconductor device according to claim 2, wherein the measuring object is configured by periodically arranging conductive patterns on one surface of a printed board in an array.

4. The semiconductor device according to claim 1, wherein the physical quantity is moisture content.

5. The semiconductor device according to claim 1, wherein a speaker is mounted in place of the antenna of the transmission device, and a microphone is mounted in place of the antenna of the reception device.

6. A physical quantity measuring device comprising:
a semiconductor device of claim 1;
a first antenna connected to the transmission device;
the measuring object to which the transmission signal is radiated from the first antenna; and
a second antenna connected to the reception device.

7. The semiconductor device according to claim 1, wherein the transmission device is configured to finish the switching of starting and stopping modulation at a second phase that is shifted by a predetermined from the first phase, wherein the reception device is further configured to store a difference of the second phase and the first phase,
wherein the estimation of the modulation switch timing and the calculation of the second phase are performed based on the difference of the second phase and the first phase.

8. A semiconductor device comprising:
a transmission device radiating, from an antenna to a measuring object, a first transmission signal generated by modulating a carrier wave with a first modulating signal, a carrier frequency of the carrier wave being a first frequency, and a second transmission signal generated by modulating the carrier wave with a second modulating signal, the carrier frequency of the carrier wave being a second frequency; and
a reception device generating a first demodulating signal by demodulating the first transmission signal, the first transmission signal receiving, with the antenna, a first reception signal via the measuring object, generating a second demodulating signal by demodulating the second transmission signal, the second transmission signal receiving, with the antenna, a second reception signal via the measuring object, and performing a processing to the first demodulating signal and the second demodulating signal,
wherein the transmission device is configured to switch starting and stopping modulation at a first phase of the carrier wave, the carrier frequency of the carrier wave being the first frequency, and switch starting and stopping the modulation at a second phase of the carrier wave, the carrier frequency of the carrier wave being the second frequency, and
wherein the reception device is configured to:
store a difference between the first phase and the second phase and a physical quantity corresponding to a phase change amount in advance;
estimate, based on a waveform of the demodulating signal, first modulation switch timing at which the first reception signal switches between a non-modulation period and a modulation period, and second modulation switch timing at which the second reception signal switches between the non-modulation period and the modulation period;
calculate a third phase that is a phase at the first modulation start timing;
calculate a fourth phase that is a phase at the second modulation start timing;
calculate a variation to a difference between the third phase and the fourth phase based on the difference between the first phase and the second phase that are stored; and
determine the physical quantity corresponding to the variation based on the physical quantity corresponding to the stored phase change amount.

9. The semiconductor device according to claim 8, wherein the reception device is configured to finish the switching of the first phase in a fifth phase, and configured to finish the switching of the second phase in a sixth phase, and
wherein the reception device is further configured to store a first difference of the fifth phase and the first phase, and configured to store a second difference of the sixth phase and the second phase,
wherein the estimation of the modulation switch timing and the calculation of the third and fourth phase are performed based on the first difference and the second difference.

* * * * *